United States Patent
Liu et al.

(10) Patent No.: US 10,937,989 B2
(45) Date of Patent: Mar. 2, 2021

(54) DISPLAY PANEL AND PREPARATION METHOD THEREOF, METHOD FOR DETERMINING FAILURE OF ENCAPSULATION PART, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Tingliang Liu, Beijing (CN); Hongwei Ma, Beijing (CN); Yue Long, Beijing (CN); Xiangdan Dong, Beijing (CN); Weiyun Huang, Beijing (CN); Yang Wang, Beijng (CN); Yunsheng Xiao, Beijng (CN); Zhenxiao Tong, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 128 days.

(21) Appl. No.: 16/051,264

(22) Filed: Jul. 31, 2018

(65) Prior Publication Data
US 2019/0140206 A1 May 9, 2019

(30) Foreign Application Priority Data
Nov. 6, 2017 (CN) .............................. 201711078449

(51) Int. Cl.
*H01L 51/52* (2006.01)
*H01L 51/00* (2006.01)
(Continued)

(52) U.S. Cl.
CPC ....... *H01L 51/5237* (2013.01); *G09G 3/3208* (2013.01); *H01L 51/0005* (2013.01);
(Continued)

(58) Field of Classification Search
CPC ............. H01L 51/5237; H01L 51/0005; H01L 51/102; H01L 51/56; H01L 27/3241; G09G 3/3208
See application file for complete search history.

(56) References Cited

U.S. PATENT DOCUMENTS

2005/0184661 A1* 8/2005 Chiu .................... G01N 27/121
313/512
2014/0141191 A1* 5/2014 Lee ..................... H01L 31/0481
428/76
(Continued)

FOREIGN PATENT DOCUMENTS

| CN | 104401933 A | 3/2015 |
| CN | 105355645 A | 2/2016 |
| CN | 107068908 A | 8/2017 |

OTHER PUBLICATIONS

Songshan Zeng et al., "Moisture-Responsive Wrinkling Surfaces with Turnable Dynamics," Advanced Materials, vol. 29, 7 pgs, 2017.
(Continued)

*Primary Examiner* — Kent W Chang
*Assistant Examiner* — Sujit Shah
(74) *Attorney, Agent, or Firm* — McDermott Will & Emery LLP

(57) ABSTRACT

A display panel includes a first substrate, a light-emitting component located on the first substrate, and an encapsulation part located on the first substrate. A receiving cavity is formed between the encapsulation part and the first substrate. The receiving cavity has a light-emitting region inside. The light-emitting component is located within the
(Continued)

light-emitting region. The display panel further includes at least one water vapor detecting part located on the first substrate and inside the receiving cavity. The at least one water vapor detecting part is disposed outside the light-emitting region. Each of the water vapor detecting part has different light transmittance before and after water absorption.

16 Claims, 5 Drawing Sheets

(51) Int. Cl.
    *H01L 51/56*     (2006.01)
    *G09G 3/3208*     (2016.01)
    *H01L 51/10*     (2006.01)
    *H01L 27/32*     (2006.01)

(52) U.S. Cl.
    CPC ............ *H01L 51/102* (2013.01); *H01L 51/56* (2013.01); *H01L 27/3241* (2013.01)

(56) References Cited

U.S. PATENT DOCUMENTS

| | | | |
|---|---|---|---|
| 2015/0329656 A1* | 11/2015 | Kim | G01N 21/81 524/547 |
| 2015/0356926 A1* | 12/2015 | Bae | H01L 51/5253 345/212 |
| 2016/0139500 A1 | 5/2016 | Kim et al. | |
| 2016/0204380 A1* | 7/2016 | Tsai | H01L 51/5253 257/40 |
| 2017/0003229 A1* | 1/2017 | Yunker | G01N 21/81 |
| 2017/0100926 A1* | 4/2017 | Kano | B32B 9/02 |
| 2017/0248514 A1* | 8/2017 | Pavey | G01N 33/0036 |
| 2018/0034130 A1* | 2/2018 | Jang | H01L 27/3225 |
| 2018/0124933 A1* | 5/2018 | Park | H01L 27/32 |

OTHER PUBLICATIONS

Third Office Action issued in related Chinese Patent Application No. 201711078449.X, dated Sep. 19, 2019, with English translation.
Notification of the First Office Aciton issued in Chinese Patent Application No. 201711078449.X, dated Dec. 27, 2018; with English translation.

* cited by examiner

DISPLAY PANEL AND PREPARATION METHOD THEREOF, METHOD FOR DETERMINING FAILURE OF ENCAPSULATION PART, AND DISPLAY DEVICE

CROSS-REFERENCE TO RELATED APPLICATION

This application claims priority to Chinese Patent Application No. 201711078449.X, filed on Nov. 6, 2017, titled "OLED DISPLAY PANEL AND PREPARATION METHOD, METHOD FOR DETERMINING FAILURE OF ENCAPSULATION PART, AND DISPLAY DEVICE", which is incorporated herein by reference in its entirety.

TECHNICAL FIELD

The present disclosure relates to the field of display technology, in particular, to a display panel and a preparation method thereof, a method for determining failure of encapsulation part, and a display device.

BACKGROUND

An OLED (Organic Light Emitting Diode) display is a self-luminous display, having the characteristics of fast response, high contrast, wide viewing angle, etc. Therefore, it receives wide attention. As a new generation of display manner, it has been widely applied to mobile phone screens, computer displays, full-color computers, etc.

SUMMARY

In a first aspect, a display panel is provided. The display panel comprises a first substrate, a light-emitting component located on the first substrate, and an encapsulation part located on the first substrate. A receiving cavity is formed between the encapsulation part and the first substrate. The receiving cavity has a light-emitting region inside. The light-emitting component is located within the light-emitting region. The display panel further comprises at least one water vapor detecting part located on the first substrate and inside the receiving cavity. The at least one water vapor detecting part is disposed outside the light-emitting region. Each of the at least one water vapor detecting part has different light transmittance before and after water absorption.

In some embodiments of the present disclosure, the each of the at least one water vapor detecting part comprises at least one hydrophobic film layer and at least one hydrophilic film layer. The at least one hydrophobic film layer and the at least one hydrophilic film layer are alternately stacked. In cases that one of the at least one hydrophilic film layer absorbs water, there is to be a wrinkle at an interface between the one of the at least one hydrophilic film layer and one of the at least one hydrophobic film layer.

In some embodiments of the present disclosure, the at least one water vapor detecting part is disposed surrounding the light-emitting region.

In some embodiments of the present disclosure, the display panel has a plurality of water vapor detecting parts. A gap is provided between any adjacent two of the plurality of water vapor detecting parts.

In some embodiments of the present disclosure, the each of the at least one water vapor detecting part has a frame-like structure having a cross section of a closed shape in a direction parallel to the first substrate.

In some embodiments of the present disclosure, the each of the at least one water vapor detecting part comprises a plurality of water vapor detecting sections which are spaced from each other.

In some embodiments of the present disclosure, the encapsulation part comprises a thin film encapsulation layer. The thin film encapsulation layer at least covers a surface of the each of the at least one water vapor detecting part at a side away from the first substrate and a surface of the light-emitting component at a side away from the first substrate.

In some embodiments of the present disclosure, the encapsulation part further comprises a second substrate disposed on a side of the thin film encapsulation layer away from the first substrate, and an encapsulant located between the thin film encapsulation layer and the second substrate. The thin film encapsulation layer covers the surface of the each of the at least one water vapor detecting part at the side away from the first substrate and the surface of the light-emitting component at the side away from the first substrate. The encapsulant covers a surface of one of the at least one water vapor detecting part, which is farthest from the light-emitting component, at a side away from the light-emitting component. The encapsulant is in contact with the first substrate.

In some embodiments of the present disclosure, the encapsulation part further comprises a second substrate disposed on a side of the thin film encapsulation layer away from the first substrate, and an encapsulant located between the thin film encapsulation layer and the second substrate. The thin film encapsulation layer covers the surface of the each of the at least one water vapor detecting part at the side away from the first substrate, the surface of the light-emitting component at the side away from the first substrate, and a surface of one of the at least one water vapor detecting part, which is farthest from the light-emitting component, at a side away from the light-emitting component. Both the encapsulant and the thin film encapsulation layer are in contact with the first substrate.

In some embodiments of the present disclosure, the encapsulation part comprises an encapsulant and a second substrate. The encapsulant covers the surface of the each of the at least one water vapor detecting part at the side away from the first substrate, the surface of the light-emitting component at the side away from the first substrate, and a surface of one of the at least one water vapor detecting part, which is farthest from the light-emitting component, at a side away from the light-emitting component. The encapsulant is in contact with the first substrate. The second substrate is located on a surface of the encapsulant at a side away from the first substrate.

In some embodiments of the present disclosure, the display panel further comprises at least one blocking part located on the first substrate and inside the receiving cavity. The at least one blocking part is disposed outside the light-emitting region. The at least one blocking part is configured to, in an ink-jet printing process, block organic solution which is to constitute the thin film encapsulation layer.

In some embodiments of the present disclosure, one of the at least one water vapor detecting part is disposed between one of the at least one blocking part and the light-emitting region.

In some embodiments of the present disclosure, the display panel comprises a plurality of blocking parts. One of the at least one water vapor detecting part is disposed between adjacent two of the plurality of blocking parts.

In some embodiments of the present disclosure, the material constituting the at least one hydrophilic film layer comprises polyvinyl alcohol. The material constituting the at least one hydrophobic film layer comprises polydimethylsiloxane.

In some embodiments of the present disclosure, the display panel is an OLED display panel. The light-emitting component is an OLED light-emitting component.

In a second aspect, a display device is provided, comprising the display panel according the first aspect.

In a third aspect, a preparation method of the display panel according to the first aspect is provided. The method comprises: forming at least one water vapor detecting part and a light-emitting component on a first substrate, wherein each of the at least one water vapor detecting part has different light transmittance before and after water absorption; and forming an encapsulation part on the first substrate, thereby forming an receiving cavity, configured to receive the light-emitting component and the at least one water vapor detecting part, between the encapsulation part and the first substrate. The receiving cavity has a light-emitting region inside, the light-emitting component is located within the light-emitting region, and the at least one water vapor detecting part is disposed outside the light-emitting region.

In some embodiments of the present disclosure, forming the at least one water vapor detecting part on the first substrate comprises: coating hydrophobic solution and hydrophilic solution on the first substrate alternately, respectively surrounding the light-emitting region, to form at least one hydrophobic film layer and at least one hydrophilic film layer which are alternately stacked.

In some embodiments of the present disclosure, forming the at least one water vapor detecting part on the first substrate further comprises: patterning the at least one hydrophobic film layer and the at least one hydrophilic film layer, to form the at least one water vapor detecting part. One of the at least one water vapor detecting part has a frame-like structure having a cross section of a closed shape in a direction parallel to the first substrate, and is disposed around the light-emitting region. Or, one of the at least one water vapor detecting part is formed by a plurality of water vapor detecting sections which are spaced from each other and arranged around the light-emitting region.

In a fourth aspect, a method for determining failure of the encapsulation part of the display panel according the first aspect is provided. The method comprises: detecting light transmittance of the at least one water vapor detecting part, and determining whether the encapsulation part fails or not based on a result of the detecting.

BRIEF DESCRIPTION OF THE DRAWINGS

FIG. 4 is a principle diagram of a change in the light transmittance of a water vapor detecting part in the display panel shown in FIG. 2a;

FIG. 8b is a partial diagram of the display panel shown in FIG. 8a;

DETAILED DESCRIPTION

The technical solutions in embodiments of the present disclosure will be described clearly and completely with reference to the accompanying drawings in embodiments of the present disclosure. Obviously, the described embodiments are merely some but not all of the embodiments of the present disclosure. All other embodiments made on the basis of embodiments of the present disclosure by a person of ordinary skill in the art without paying any creative effort shall be included in the protection scope of the present disclosure.

The OLED display can be divided into the PMOLED (Passive-matrix Organic Light Emitting Diode) and the AMOLED (Active-matrix Organic Light Emitting Diode).

A bottleneck restricting the development of the OLED display industry is the short life. Taking the AMOLED display as an example, the AMOLED display generally comprises a backplane circuit, a cathode, an anode and an organic light-emitting functional layer located between the cathode and the anode. A reason of the short life of the AMOLED display is that its electrode and organic materials of the organic light-emitting functional layer are very sensitive to contaminants, water vapor, and oxygen in atmosphere, and easily suffer electrochemical corrosion in an environment containing water vapor and oxygen, making the AMOLED display fail. Therefore, the OLED display is to be effectively encapsulated, so as to prevent water vapor and oxygen from entering the interior of the OLED display.

The encapsulation structure of the OLED display comprises the encapsulation thin film, the encapsulation cover plate, etc. After finishing preparing the encapsulation structure, the preparation for the OLED display further comprises processes of cutting, IC (Integrated Circuit) bonding, etc., and all the above processes may have effects on the encapsulation structure. In cases which are serious, it will cause failure of the encapsulation structure. However, the failure of the encapsulation structure often occurs inadvertently. During the preparation process of the OLED display, it is impossible to timely determine the occurrence of the failure of the encapsulation structure. If the failure reason has not been analyzed until the encapsulation structure completely fails, the water vapor has intruded inside the OLED display at this moment, such that the OLED display is incapable of working. Therefore, it is impossible to determine during which process stage the failure of the encapsulation structure occurs, which is disadvantageous for mass production and process improvement of the OLED display.

Figure 1:
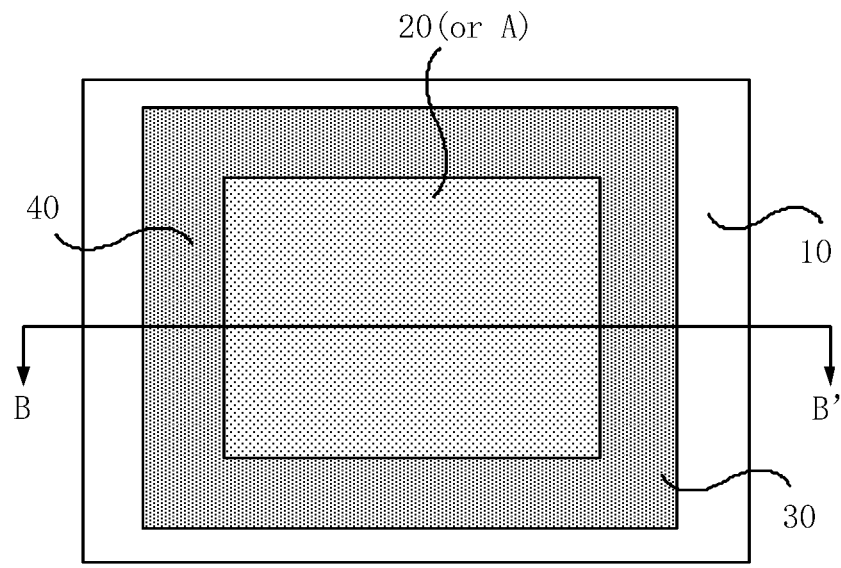
FIG. 1 is a plane diagram of a display panel provided by some embodiments of the present disclosure.

Regarding the above problem, some embodiments of the present disclosure provide a display panel. As shown in FIG. 1, the display panel comprises a first substrate 10, a light-emitting component 20 on the first substrate 10, and an encapsulation part 30 on the first substrate 10.

Figure 2A:
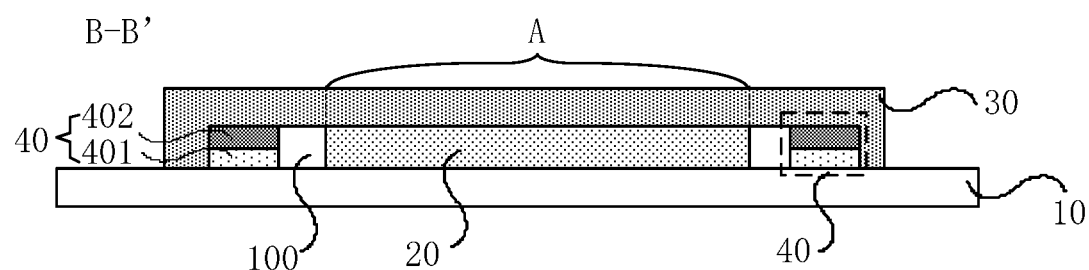
FIG. 2a is a sectional view of the display panel shown in FIG. 1 cut along the line of B-B'.

As shown in FIG. 2a, a receiving cavity 100 is formed between the encapsulation part 30 and the first substrate. The receiving cavity 100 has a light-emitting region A inside. The above light-emitting component 20 is located within the light-emitting region A. It should be noted that, the material of the first substrate 10 will not be limited by the present disclosure. For example, the material constituting the first substrate 10 is able to be polyimide resin, and in this case the first substrate 10 is also able to be called PI substrate.

Besides being an OLED display panel, the above display panel is able to be an LED display. In cases that the display panel is an LED display panel, the above light-emitting component 20 is an LED light-emitting component. In cases that the display panel is an OLED display panel, the above light-emitting component 20 is an OLED light-emitting component. For convenience of description, some following embodiments are described by examples that the display panel is an OLED display panel and the light-emitting component is an OLED light-emitting component.

In addition, in some embodiments, the light-emitting component 20 comprises a cathode in a whole-layer form, a plurality of anodes corresponding to different sub-pixels, and organic functional layers corresponding to the different sub-pixels between the cathode and the anodes, etc. By applying power to the cathode and the anodes respectively, it is possible to cause a light-emitting layer corresponding to one of the sub-pixels in the organic functional layer to emit light. For example, the light-emitting layer is an organic light-emitting layer. In this situation, as shown in FIG. 2a, the display panel comprises one light-emitting component 20. And as shown in FIG. 1, the region enclosed by contour lines of the light-emitting component 20 serves as the light-emitting region A.

Figure 2B:
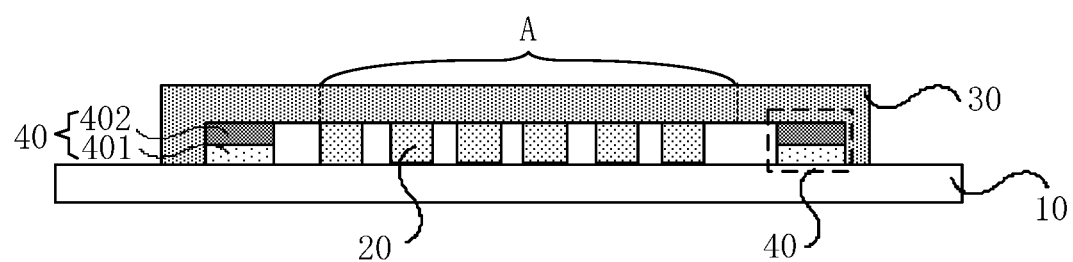
FIG. 2b is another structural diagram of the display panel shown in FIG. 1 with another light-emitting component.

Alternatively, in some embodiments, a minimum unit for realizing the display function in the OLED display panel serves as the light-emitting component 20. The minimum unit includes a part of the cathode, an anode, and an organic functional layer which are in one sub-pixel. In this case, as shown in FIG. 2b, the display panel comprises a plurality of OLED light-emitting components 20. The gaps among the light-emitting components 20 in FIG. 2b is for illustrating that in the OLED display panel, the light-emitting components 20 and the sub-pixels are in a one-to-one correspondence. Upon the display panel being actually prepared, there are no obvious gaps among the light-emitting components 20 which are corresponding to the sub-pixels.

Figure 3:
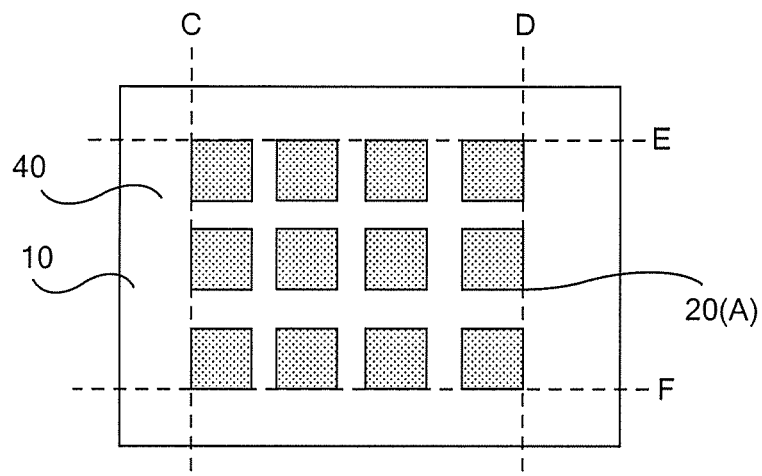
FIG. 3 is a diagram of dividing the light-emitting region in the display panel shown in FIG. 1.

In this situation, as shown in FIG. 3, taking a plurality of light-emitting components 20 in array arrangement as examples, the region enclosed by the left contour line C of the left-most column of light-emitting components 20, the right contour line D of the right-most column of light-emitting components 20, the upper contour line E of the upper-most row of light-emitting components 20, and the lower contour line F of the lower-most row of light-emitting components 20 serves as the light-emitting region A.

In this article, 'upper', 'lower', 'left', 'right', and other terms of orientation are defined with respect to the orientation of the display panel being disposed in a drawing schematically. It should be understood that these directional terms are in relative concepts, they are used for relative description and clarification, and they are changeable on the basis of the orientation of the display panel being disposed.

In addition, the above display panel, as shown in FIG. 2a, further comprises at least one water vapor detecting part 40 located on the first substrate 10, and inside the receiving cavity 100. The at least one water vapor detecting part 40 is disposed outside the light-emitting region A. Each water vapor detecting part 40 has different light transmittance before and after water absorption.

In this situation, after finishing the preparation of the encapsulation part 30, during subsequent preparation processes of the display panel, it is able to detect the light transmittance of the water vapor detecting part 40 in the display panel after finishing each process stage, to determine whether the encapsulation part 30 fails or not. Such that it is able to determine during which process stage the encapsulation part 30 fails. In this way, it is possible to improve the process stage during which the encapsulation part 30 fails, such that it is in favor of the mass production and process improvement of the display panel.

On this basis, in order to avoid extending preparation time of display panels due to determining whether each encapsulation part 30 fails or not, in some embodiments of the present disclosure, after finishing each process stage, the light transmittance of water vapor detecting parts 40 is sampling detected, and the preparation process is to be improved according to the result of the sampling detection.

In some embodiments of the present disclosure, the water vapor detecting part 40 as shown in FIG. 2a, includes at least one hydrophobic film layer 401 and at least one hydrophilic film layer 402. The at least one hydrophobic film layer 401 and the at least one hydrophilic film layer 402 as above described are alternately stacked. In cases that a hydrophilic film layer 402 absorbs water, there is to be a wrinkle generated at an interface between a hydrophobic film layer 401 and the hydrophilic film layer 402.

Figure 4:
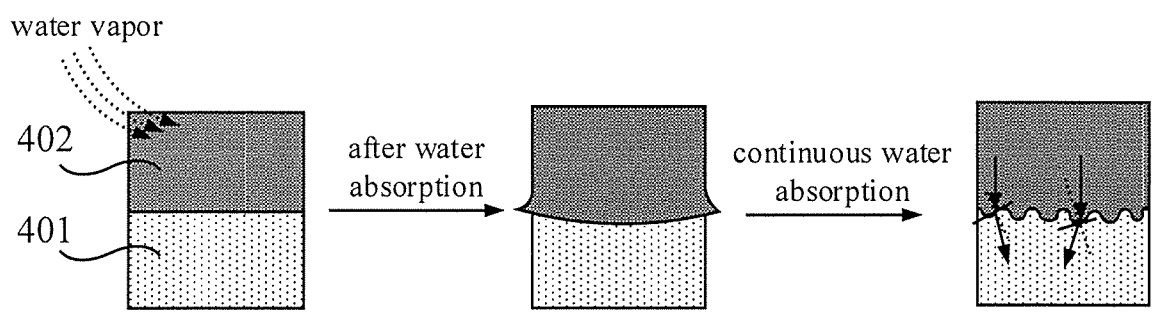

In this situation, in cases that the encapsulation part 30 fails in a partial position, the water vapor is to intrude into a water vapor detecting part 40 through this partial position. Due to the hydrophilic property of the hydrophilic film layer 402, as shown in FIG. 4, the hydrophilic film layer 402 therein is to swell, bringing compressive stress onto the hydrophobic film layer 401 therein. Upon the compressive stress exceeding the critical compressive stress of the hydrophobic film layer 401, as shown in FIG. 4, the wrinkle is to be generated at the interface between the hydrophilic film layer 402 and the hydrophobic film layer 401. Due to the effects of the refraction and diffuse reflection of light at the interface of wrinkled shape, the light transmittance of the water vapor detecting part 40 changes before and after the interface wrinkles, such that the macroscopic transparency of the water vapor detecting part 40 changes. Therefore, by detecting the light transmittance of the water vapor detecting part 40, and according to the change thereof, it can determine whether there is water vapor intruding into the water vapor detecting part 40 or not, thereby determining whether the encapsulation part 30 fails.

In some embodiments of the present disclosure, multiple hydrophobic film layers 401 and multiple hydrophilic film layers 402 are alternately disposed, in this case, the number of the interfaces formed between a hydrophobic film layer 401 and a hydrophilic film layer 402 is the largest. Upon wrinkles are generated at the interfaces, due to the effects of the refraction and diffuse reflection of light at the interfaces in wrinkled shape, the light transmittance of the water vapor detecting part 40 changes before and after the interfaces wrinkle. Since the number of the above interfaces is large, before and after the interfaces wrinkle, the change in the light transmittance of the water vapor detecting part 40 can be more remarkable.

Alternatively, in order to realize lighter and thinner disposition of the display panel, in some embodiments of the present disclosure, the above water vapor detecting part 40 is able to comprise one hydrophobic film layer 401 and one hydrophilic film layer 402 which are stacked.

For convenience, in the following description, the drawings provided by the present disclosure are illustrated by taking the water vapor detecting part 40 comprising one hydrophobic film layer 401 and one hydrophilic film layer 402 which are stacked as examples.

In addition, the up and down positional relation between the hydrophobic film layer 401 and the hydrophilic film layer 402 will not be limited by the present disclosure. In some embodiments of the present disclosure, as shown in FIG. 2a, the water vapor detecting part 40 comprises the hydrophilic film layer 402 disposed on the first substrate 10 and the hydrophobic film layer 401 disposed on the hydrophilic film layer 402. In some other embodiments of the present disclosure, the water vapor detecting part 40 comprises the hydrophobic film layer 401 disposed on the first substrate 10 and the hydrophilic film layer 402 disposed on the hydrophobic film layer 401.

In addition, the material constituting the hydrophobic film layer 401 and the material constituting the hydrophilic film layer 402 will not be limited, as long as a wrinkle is able to be generated at the interface between the hydrophobic film layer 401 and the hydrophilic film layer 402 after the hydrophilic film layer 402 absorbs water. In some embodiments of the present disclosure, the material constituting the hydrophilic film layer 402 comprises polyvinyl alcohol (PVA); and the material constituting the hydrophobic film layer 401 comprises polydimethylsiloxane (PDMS). In this situation, there is able to be an obvious wrinkle generated at the interface between the hydrophobic film layer 401 and the hydrophilic film layer 402, such that the change in the light transmittance of the water vapor detecting part 40 is more obvious.

In addition, the thickness of the water vapor detecting part 40 will not be limited by the present disclosure. For avoiding increasing the thickness of the display panel due to disposing the water vapor detecting part 40, in some embodiments of the present disclosure, the thickness of the water vapor detecting part 40 is smaller than or equal to the thickness of the light-emitting component 20. On this basis, the hydrophilic film layer 402 of the water vapor detecting part 40 is able to swell after absorbing water. In order to ensure there is space for the hydrophilic film layer 402 to swell, in some embodiments of the present disclosure, the thickness of the water vapor detecting part 40 is smaller than the thickness of the light-emitting component 20. The thickness of the water vapor detecting part 40 and the thickness of the light-emitting component 20 are along the direction perpendicular to the first substrate 10.

Figure 5:
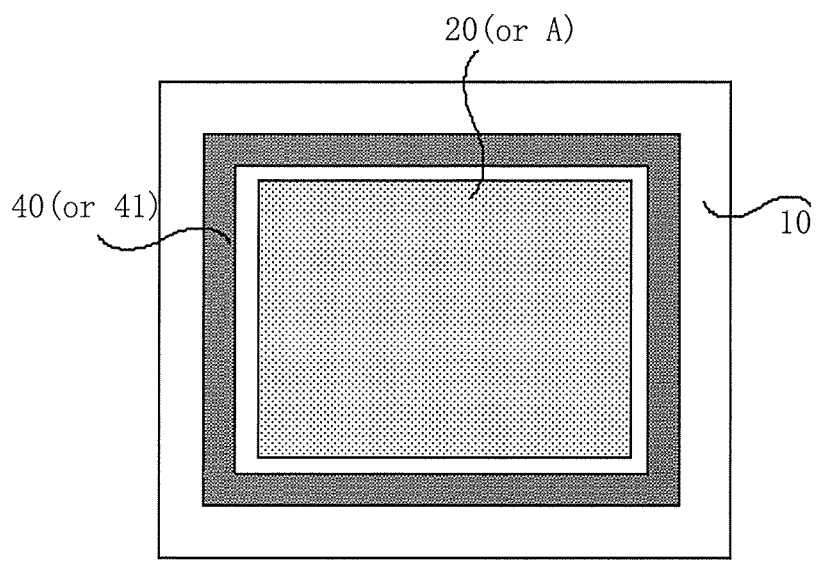
FIG. 5 is a plane diagram of another display panel provided by some embodiments of the present disclosure.

It is easy for water vapor to intrude into the light-emitting component 20 from a position where the encapsulation part 30 is in contact with the first substrate 10. For improving the detection effect of the effectiveness of the encapsulation part 30, in some embodiments of the present disclosure, as shown in FIG. 5, FIG. 6 or FIG. 8a (the encapsulation part 30 is not shown in these above drawings), each water vapor detecting part 40 surrounds the light-emitting region A, such that it is able to determine the failure condition of each side surface of the encapsulation part 30, located around the light-emitting region A, by the above water vapor detecting part 40.

Figure 6:
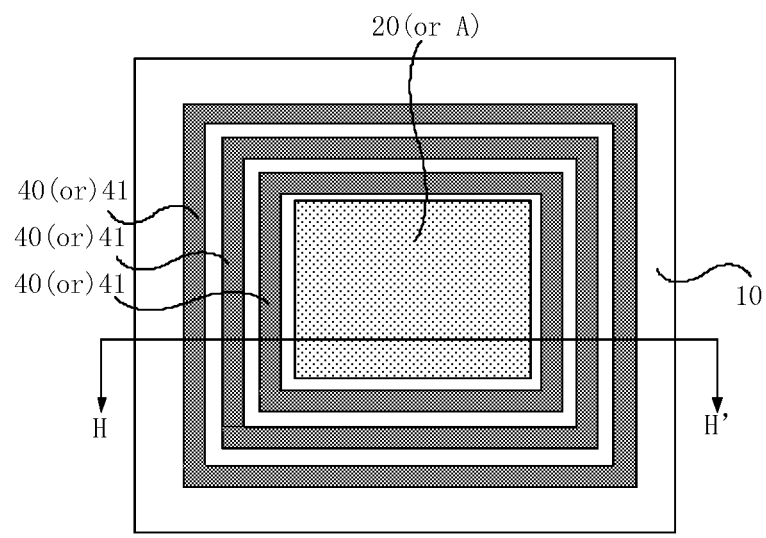
FIG. 6 is a structural diagram of that the display panel shown in FIG. 5 includes a plurality of nested water vapor detecting frames.
Figure 7:
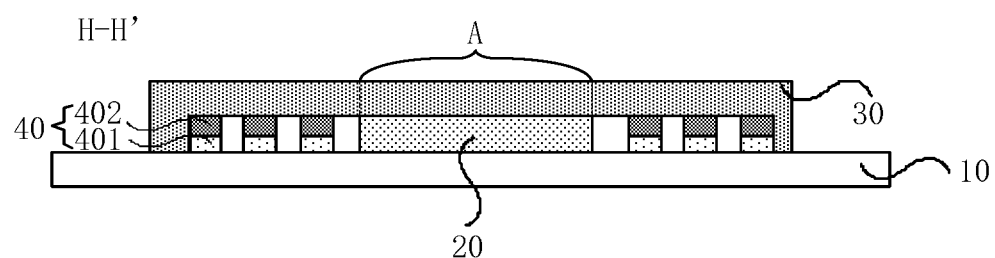
FIG. 7 is a sectional view of the display panel shown in FIG. 6 cut along the line of H-H'.
Figure 8A:
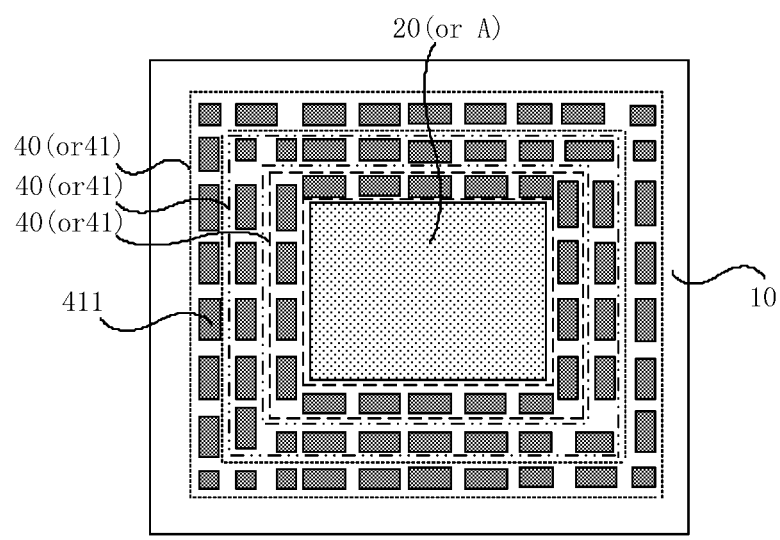
FIG. 8a is a structural diagram of that the water vapor detecting frames of the display panel shown in FIG. 6 includes a plurality of water vapor detecting sections spaced from each other.

As shown in FIG. 6 or FIG. 8a, in the situations where the above display panel has a plurality of water vapor detecting parts 40, a gap is provided between any two adjacent water vapor detecting parts 40.

In this situation, the plurality of water vapor detecting parts 40 surrounding the light-emitting region A are disposed apart from each other. Upon the encapsulation part 30 failing in a position, water vapor will intrude into one of the water vapor detecting parts 40 corresponding to this position, such that the light transmittance of the one of the water vapor detecting parts 40 corresponding to this position changes. In this way, the position of failure on the encapsulation part 30 can be determined according to the position of the one of the water vapor detecting parts 40 where the light transmittance changes, such that the preparation process for the failure position in the encapsulation part 30 can be improved, and accordingly it is in favor of guiding the detailed improvement of the preparation process of the display panel.

The structure of the water vapor detecting part(s) 40 disposed around the light-emitting region A will be illustrated in details as follows.

In some embodiments of the present disclosure, each water vapor detecting part 40, as shown in FIG. 5 or FIG. 6, is able to have a frame-like structure having a cross section of a closed shape in a direction parallel to the first substrate. A water vapor detecting part in the frame-like structure is able to serve as a water vapor detecting frame 41. FIG. 5 is an illustration taking one closed water vapor detecting frame 41 as an example. FIG. 6 is an illustration taking three closed water vapor detecting frames 41 as an example.

The contour shape of a region enclosed by the above water vapor detecting frame(s) 41 matches the contour shape of the light-emitting region A, which will not be limited by the present disclosure. In some embodiments of the present disclosure, in cases that the contour shape of the light-emitting region A is rectangular, the contour shape of the region enclosed by the above water vapor detecting frame(s) 41 is able to be rectangular as shown in FIG. 5 and FIG. 6. Alternatively, in some other embodiments of the present disclosure, in cases that the contour shape of the light-emitting region A is circular, the contour shape of the region enclosed by the water vapor detecting frame(s) 41 is also able to be circular.

Figure 8B:
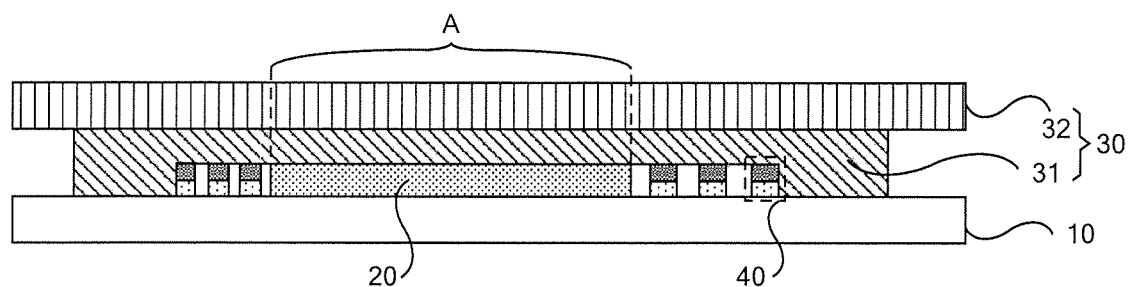

In some embodiments of the present disclosure, as shown in FIG. 8, each water vapor detecting frame 41 comprises a plurality of water vapor detecting sections 411 spaced from each other. It should be noted that, the shape of each water vapor detecting section 411 will not be limited by embodiments of the present disclosure. For example, a water vapor detecting section 411 is able to be a strip, a square block, a cylindrical block, etc.

In this situation, referring to FIG. 8, upon the encapsulation part 30 failing in a partial position, it is easy for water vapor to intrude into a water vapor detecting section 411 from this position, making the light transmittance of this water vapor detecting section 411 change. Such that, it is able to determine whether the encapsulation part 30 fails or not, according to the change in the light transmittance of the water vapor detecting section 411. In this way, it is able to further determine the exact position where the encapsulation part 30 fails more accurately according to the position of the water vapor detecting section 411.

On this basis, the structure of the encapsulation part 30 will not be limited by embodiments of the present disclosure. Some structures of the encapsulation part 30 are illustrated as follows.

Figure 9:
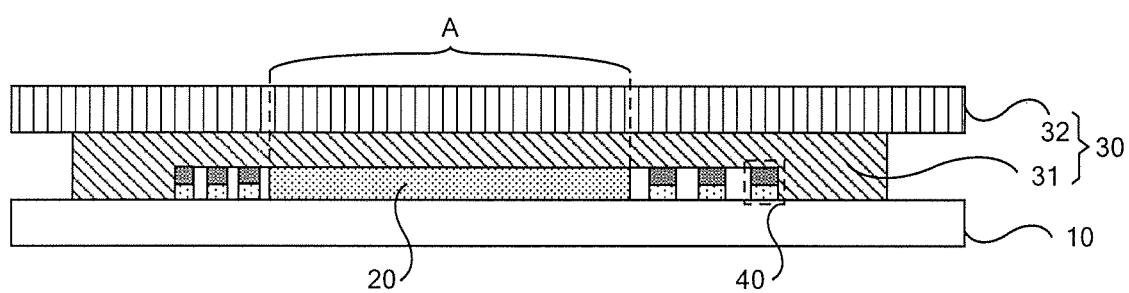
FIG. 9 is a structural diagram of that an encapsulation part, of the display panel shown in FIG. 1, includes an encapsulant and a second substrate.

As shown in FIG. 9, the encapsulation part 30 comprises an encapsulant 31 and a second substrate 32. The encapsulant 31 covers a surface of the water vapor detecting part(s) 40 at a side away from the first substrate 10, a surface of the light-emitting component 20 at a side away from the first substrate 10, and a surface of the water vapor detecting part 40, farthest from the light-emitting component 20, at a side away from the light-emitting component 20.

In addition, the encapsulant 31 is in contact with the first substrate 10. The second substrate 32 is located on a surface of the encapsulant 31 at side away from the first substrate 10.

It should be noted that, the material constituting the second substrate 32 will not be limited by embodiments of the present disclosure. For example, the material constituting the second substrate 32 is able to be glass, metal, quartz, plastic resin, etc.

Figure 10:
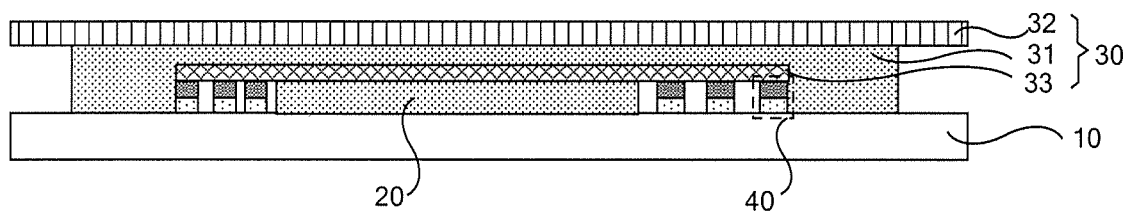
FIG. 10 is a structural diagram of that an encapsulation part, of the display panel shown in FIG. 1, includes an encapsulant, a second substrate and a thin film encapsulation layer.
Figure 11:
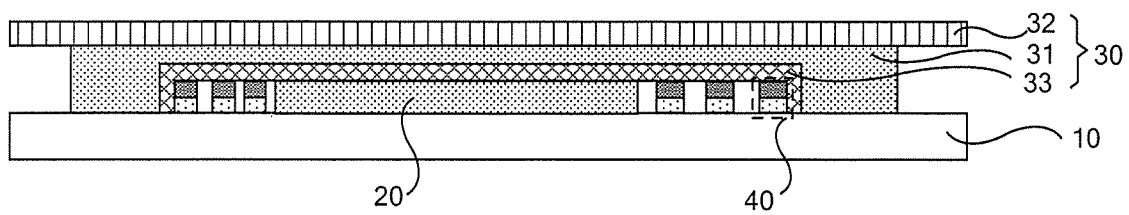
FIG. 11 is a diagram of another positional relationship between the thin film encapsulation layer and the encapsulant in the display panel shown in FIG. 10.
Figure 12:
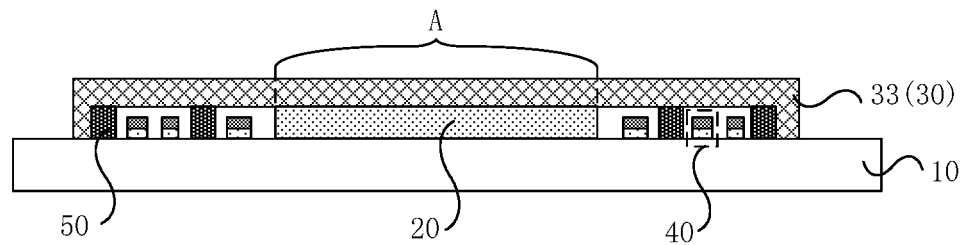
FIG. 12 is a structural diagram of that an encapsulation part, of the display panel shown in FIG. 1, includes a thin film encapsulation layer.

Alternatively, as shown in FIG. 10, FIG. 11 or FIG. 12, the encapsulation part 30 comprises a thin film encapsulation layer 33. The thin film encapsulation layer 33 at least covers a surface of the water vapor detecting part(s) 40 at side away from the first substrate 10, and a surface of the light-emitting component 20 at a side away from the first substrate 10.

For example, a specific structure of the encapsulation part 30 having the thin film encapsulation layer 33 will be illustrated as follows.

For example, as shown in FIG. 10, the encapsulation part 30 further comprises a second substrate 32 disposed on a side of thin film encapsulation layer 33 away from the first substrate 10, and an encapsulant 31 located between the thin film encapsulation layer 33 and the second substrate 32.

The thin film encapsulation layer 33 covers a surface of the water vapor detecting part(s) 40 at a side away from the first substrate 10, and a surface of the light-emitting component 20 at a side away from the first substrate 10. The encapsulant 31 covers a surface of the water vapor detecting part 40, farthest from the light-emitting component 20, at a side away from the light-emitting component 20. The encapsulant 31 is in contact with the first substrate 10.

Alternatively, for another example, as shown in FIG. 11, the encapsulation part 30 further comprises a second substrate 32 disposed on a side of thin film encapsulation layer 33 away from the first substrate 10, and an encapsulant 31 located between the thin film encapsulation layer 33 and the second substrate 32.

The thin film encapsulation layer 33 covers a surface of the water vapor detecting part(s) 40 at a side away from the first substrate 10, a surface of the light-emitting component 20 at a side away from the first substrate 10, and a surface of the water vapor detecting part 40, farthest from the light-emitting component 20, at a side away from the light-emitting component 20. Both the encapsulant 31 and the thin film encapsulation layer 33 are in contact with the first substrate 10.

Alternatively, for yet another example, as shown in FIG. 12, the encapsulation part 30 only comprises a thin film encapsulation layer 33. The thin film encapsulation layer 33 covers a surface of the water vapor detecting part(s) 40 at a side away from the first substrate 10, a surface of the light-emitting component 20 at a side away from the first substrate 10, and a surface of the water vapor detecting part 40, farthest from the light-emitting component 20, at a side away from the light-emitting component 20. The above thin film encapsulation layer 33 is in contact with the first substrate 10.

It should be noted that, in some embodiments of the present disclosure, it is able to form the thin film encapsulation layer 33 by ink-jet printing. For preventing organic solution which is to constitute the thin film encapsulation layer 33 from overflowing during ink-jet printing, and from influencing subsequent bonding of an IC (integrated circuit). As shown in FIG. 12, in some embodiments, the display panel further comprises at least one blocking part (DAM) 50 located on the first substrate, and inside the receiving cavity.

The at least one blocking part 50 is disposed outside the light-emitting region A, the blocking part 50 is configured to, during the ink-jet printing process, block organic solution which is to constitute the thin film encapsulation layer 33.

In this situation, in cases that the above display panel comprises a plurality of blocking parts 50, a water vapor detecting part 40 is able to be disposed between two adjacent blocking parts 50.

Alternatively, a water vapor detecting part 40 is disposed between a blocking part 50 and the light-emitting region A.

Some embodiments of the present disclosure provide a display panel comprising any of the display panels as above described. In some embodiments, the display device is an OLED display device. The OLED display device is able to be any product or component having display function, such as a mobile phone, a tablet computer, a television, a display, a laptop, a digital photo frame, a navigator, etc. The above display device includes the same structure and has the same beneficial effects with the display panel provided by the above embodiments. Since the structure and beneficial effects have been described in detail in the above embodiments, they are not reiterated herein.

Figure 13:
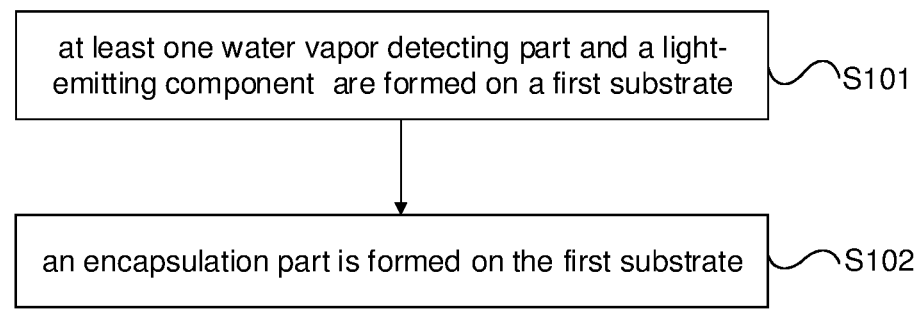
FIG. 13 is a flow chart of a preparation method, for a display panel, provided by some embodiments of the present disclosure.

Some embodiments of the present disclosure provides a preparation method of the display panel as above described. As shown in FIG. 13, the method comprises S101 and S102.

Figure 14:
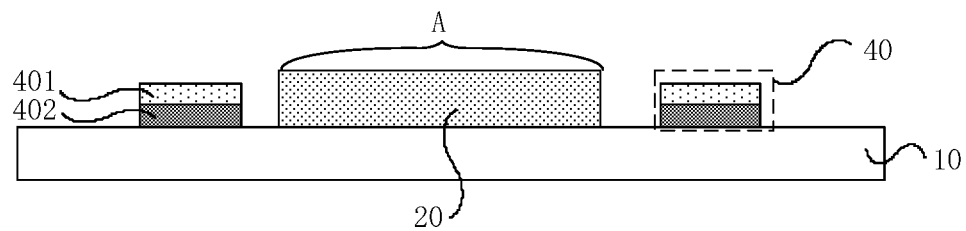
FIG. 14 is a diagram of a process for preparing a display panel according the preparation method shown in FIG. 13.

S101, as shown in FIG. 14, at least one water vapor detecting part 40 and a light-emitting component 20 are formed on a first substrate 10.

Each water vapor detecting part 40 has different light transmittance before and after water absorption.

It should be noted that, first, the method is configured to prepare both an LED display panel and an OLED display panel; second, the order of forming the at least one water vapor detecting part 40 and the light-emitting component 20 will not be limited by embodiments of the disclosure. For example, it is able to form an OLED light-emitting component 20 on the first substrate 10 firstly, and then form the at least one water vapor detecting part 40 on the first substrate 10. For another example, it is able to form the at least one water vapor detecting part 40 on the first substrate 10 firstly, and then form the OLED light-emitting component 20 on the first substrate 10.

In addition, for example, the light-emitting component 20 being formed on the first substrate 10 comprises: a driving circuit is formed on the first substrate 10 firstly, and a first electrode, an organic light-emitting functional layer and a second electrode are successively formed. The preparation process of the first electrode, the organic light-emitting functional layer and the second electrode is able to be the same with a preparation process of an existing light-emitting component 20, and will not be reiterated herein.

S102, as shown in FIG. 2a, an encapsulation part 30 is formed on the first substrate 10.

A receiving cavity 100 for receiving the light-emitting component 20 and the at least one water vapor detecting part 40 is formed between the encapsulation part 30 and the first substrate 10. The receiving cavity 100 has a light-emitting region A inside. The light-emitting component 20 is located within the light-emitting region A. The at least one water vapor detecting part 40 is disposed outside the light-emitting region A.

It should be noted that, the light-emitting region A is predefined, instead of being determined after forming the light-emitting component 20.

It should be noted that, the structure of the encapsulation part 30 will not be limited by the present disclosure. For example, the encapsulation part 30 is able to be any one shown in FIG. 9, FIG. 10, FIG. 11, and FIG. 12. The preparation process of the above encapsulation part 30 is able to be the same with a preparation process of an existing encapsulation part 30 in a display panel, and will not be reiterated herein.

In addition, a water vapor detecting part 40 as above described comprises at least one hydrophobic film layer 401 and at least one hydrophilic film layer 402 which are alternately stacked. In cases that a hydrophilic film layer 402 absorbs water, there is able to be a wrinkle generated at an interface between the hydrophilic film layer 402 and a hydrophobic film layer 401.

On this basis, upon the encapsulation part 30 failing in a partial position, water vapor will intrude into a water vapor detecting part 40 through this partial position. Due to the hydrophilic property of a hydrophilic film layer 402 in the water vapor detecting part 40, as shown in FIG. 4, the hydrophilic film layer 402 is to swell, bringing compressive stress onto a hydrophobic film layer 401. Upon the compressive stress exceeding the critical compressive stress of the hydrophobic film layer 401, as shown in FIG. 4, a wrinkle will be generated at an interface between the hydrophilic film layer 402 and the hydrophobic film layer 401. Due to the effects of the refraction and diffuse reflection of light at the interface in wrinkled shape, before and after the interface wrinkles, the light transmittance of the water vapor detecting part 40 changes, making the macroscopic transparency of the water vapor detecting part 40 change. Therefore, by detecting the light transmittance of the at least one water vapor detecting part 40, and according to the change in the light transmittance of the at least one water vapor detecting part 40, it can determine whether there is water vapor intruding into the at least one water vapor detecting part 40 or not, and thereby determine whether the encapsulation part 30 fails or not.

In addition, after finishing the preparation of the encapsulation part 30, during the subsequent preparation processes of the display panel, the light transmittance of the at least one water vapor detecting part 40 of the display panel is detected after finishing each process stage, to determine whether the encapsulation part 30 fails or not, such that it can determine during which process stage the encapsulation part 30 fails. In this way, it can improve the process stage during which the encapsulation part 30 fails, such that it is in favor of the mass production and process improvement of the display panel.

In addition, it is known by those skilled in the art, it is easy for water vapor to intrude into the light-emitting component 20 from a position where the encapsulation part 30 is in contact with the first substrate 10. On this basis, for improving the detection effect of the effectiveness of the encapsulation part 30, in some embodiments of the present disclosure, the above S101 comprises: as shown in FIG. 5, hydrophobic solution and hydrophilic solution are coated on the first substrate 10 alternately, respectively surrounding the light-emitting region A, to form at least one hydrophobic film layer 401 and at least one hydrophilic film layer 402 which are alternately stacked as shown in FIG. 2a.

It should be noted that, the hydrophobic solution is able to be formed by dissolving hydrophobic material in a solvent. The hydrophobic solution is coated on the first substrate 10 around the light-emitting region A, and part or all of the solvent is evaporated by evaporation or the like steps, such that the hydrophobic film layer 401 is formed.

The formation principles of the hydrophilic solution and the hydrophilic film layer 402 are respectively the same, and will not be reiterated herein. In some embodiments of the present disclosure, the above hydrophobic material comprises polydimethylsiloxane, and hydrophilic material comprises polyvinyl alcohol.

In addition, coating sequence of the hydrophobic solution and the hydrophilic solution will not be limited by embodiments of the present disclosure. For example, it is able to coat the hydrophobic solution on the first substrate 10 around the light-emitting region A firstly, and then coat the hydrophilic solution. For another example, it is able to coat the hydrophilic solution on the first substrate 10 around the light-emitting region A firstly, and then coat the hydrophobic solution. In some embodiments of the present disclosure, it is able to repeat any one of the above coating processes at a plurality of times, such that there are to be a plurality of interfaces between the formed multiple hydrophobic film layers 401 and the formed multiple hydrophilic film layers 402 which are alternately stacked.

In this way, the at least one water vapor detecting part 40 is disposed around the light-emitting region A, such that it can determine the failure condition of each side surface of the encapsulation part 30 by the change in the light transmittance of the at least one water vapor detecting part 40.

On this basis, upon the light transmittance of a water vapor detecting part 40 changing, it can determine whether the encapsulation part 30 fails, but it may not determine a specific failure position of the encapsulation part 30.

Therefore, in order to determine the failure position of the encapsulation part 30 more accurately, in some embodiments of the present disclosure, S101 further comprises:

The at least one hydrophobic film layer 401 and the at least one hydrophilic film layer 402 are patterned, to form the at least one water vapor detecting part 40.

In some embodiments of the present disclosure, as shown in FIG. 6, a water vapor detecting part 40 has a closed frame-like structure surrounding the light-emitting region A. The above closed frame-like structure is able to serve as a water vapor detecting frame 41.

In this situation, upon the encapsulation part 30 fails in a position, water vapor will intrude into a water vapor detecting frame 41 corresponding to this position, making the light transmittance of the water vapor detecting frame 41 change. In this way, the failure position on the encapsulation part 30 can be determined according to the position of the water vapor detecting frame 41. On this basis, the preparation process for the failure position in the encapsulation part 30 is improved, which is in favor of the pertinence improvement about the display panel.

Alternatively, as shown in FIG. 8, a water vapor detecting ring 41 is formed by a plurality of water vapor detecting sections 411 spaced from each other and arranged around the light-emitting region A.

In this situation, upon the encapsulation part 30 failing in a partial position, it is easy for water vapor to intrude into a water vapor detecting section 411 from this position, making the light transmittance of the water vapor detecting section 411 change. Such that, it can determine whether the encapsulation part 30 fails or not, according to the change in the light transmittance of the water vapor detecting section 411. In this way, it can further determine the exact position where the encapsulation part 30 fails more accurately according to the position of the water vapor detecting section 411.

It should be noted that, the above patterning process is able to be performed by a patterning process. For example, different exposure regions are formed by a mask exposure process, and then multiple removal processes of etching, ashing, and the like are performed on the different exposure regions to finally obtain a desired pattern.

On this basis, as shown in FIG. 6 or FIG. 8a, in the situation that the above display panel has a plurality of water vapor detecting parts 40, a gap is provided between any two adjacent water vapor detecting parts 40.

Some embodiments of the present disclosure provide a method for determining failure of the encapsulation part in any one of the display panels above described. The method comprises: it detects the light transmittance of the at least one water vapor detecting part 40, and it determines whether the encapsulation part 30 fails or not based on the result of the detecting.

On this basis, combined with the above, upon the encapsulation part 30 failing in a partial position, water vapor will intrude into a water vapor detecting part 40 through this partial position. In the situation that the water vapor detecting part 40 comprises at least one hydrophobic film layer 401 and at least one hydrophilic film layer 402 which are alternately stacked, due to the hydrophilic property of the at least one hydrophilic film layer 402, as shown in FIG. 4, a hydrophilic film layer 402 is to swell, bringing compressive stress onto a hydrophobic film layer 401. Upon the compressive stress exceeding the critical compressive stress of the hydrophobic film layer 401, a wrinkle will be generated at an interface between the hydrophilic film layer 402 and the hydrophobic film layer 401. Due to the effects of the refraction and diffuse reflection of light at the interface in wrinkled shape, before and after the interface wrinkles, the light transmittance of the water vapor detecting part 40 changes, such that the macroscopic transparency of the water vapor detecting part 40 changes. Therefore, by detecting the light transmittance of the at least one water vapor detecting part 40, and according to the change in the light transmittance of the at least one water vapor detecting part 40, it can determine whether there is water vapor intruding into the at least one water vapor detecting part 40 or not, and thereby determine whether the encapsulation part 30 fails or not.

The above description is only the specific embodiment of the present disclosure, but the scope of the present disclosure is not limited thereto, and any person skilled in the art can easily think of changes or replacement intended to be covered by the scope of the present disclosure within the technical scope disclosed by the present disclosure. Therefore, the scope of protection of the present disclosure should be determined by the scope of the claims.

Additional embodiments including any one of the embodiments described above may be provided by the present disclosure, where one or more of its components, functionalities or structures are interchanged with, replaced by or augmented by one or more of the components, functionalities or structures of a different embodiment described above.

What is claimed is:

1. A display panel, wherein,
the display panel comprises a first substrate, a light-emitting component located on the first substrate, an encapsulation part located on the first substrate, and at least one blocking part; a receiving cavity is formed between the encapsulation part and the first substrate; the receiving cavity has a light-emitting region inside; the light-emitting component is located within the light-emitting region;
the display panel further comprises at least one water vapor detecting part located on the first substrate and inside the receiving cavity; the at least one water vapor detecting part is disposed outside the light-emitting region; and each of the at least one water vapor detecting part has different light transmittance before and after water absorption; and
the each of the at least one water vapor detecting part comprises at least one hydrophobic film layer and at least one hydrophilic film layer; and the at least one hydrophobic film layer and the at least one hydrophilic film layer are alternately stacked, wherein,
in cases that one of the at least one hydrophilic film layer absorbs water, there is to be a wrinkle at an interface between the one of the at least one hydrophilic film layer and one of the at least one hydrophobic film layer; and
the wrinkle changes the light transmittance of the at least one water vapor detecting part;
the encapsulation part comprises a thin film encapsulation layer,
the thin film encapsulation layer at least covers a surface of the at least one water vapor detecting part at a side away from the first substrate and a surface of the light-emitting component at a side away from the first substrate;
the at least one blocking part is located on the first substrate and inside the receiving cavity;
the at least one blocking part is disposed outside the light-emitting region; and
the at least one blocking part is configured to, in an ink-jet printing process, block organic solution which is to constitute the thin film encapsulation layer from overflowing from an outside of the light-emitting region to the light-emitting region.

2. The display panel according to claim 1, wherein the at least one water vapor detecting part is disposed surrounding the light-emitting region.

3. The display panel according to claim 2, wherein, the display panel has a plurality of water vapor detecting parts; and
a gap is provided between any adjacent two of the plurality of water vapor detecting parts.

4. The display panel according to claim 2, wherein the each of the at least one water vapor detecting part has a frame-like structure having a cross section of a closed shape in a direction parallel to the first substrate.

5. The display panel according to claim 2, wherein the each of the at least one water vapor detecting part comprises a plurality of water vapor detecting sections which are spaced from each other.

6. The display panel according to claim 1, wherein,
the encapsulation part further comprises a second substrate disposed on a side of the thin film encapsulation layer away from the first substrate, and an encapsulant located between the thin film encapsulation layer and the second substrate;
the thin film encapsulation layer covers the surface of the at least one water vapor detecting part at the side away from the first substrate and the surface of the light-emitting component at the side away from the first substrate;
the encapsulant covers a surface of one of the at least one water vapor detecting part, which is farthest from the light-emitting component, at a side away from the light-emitting component; and
the encapsulant is in contact with the first substrate.

7. The display panel according to claim 1, wherein,
the encapsulation part further comprises a second substrate disposed on a side of thin film encapsulation layer away from the first substrate, and an encapsulant located between the thin film encapsulation layer and the second substrate;
the thin film encapsulation layer covers the surface of the at least one water vapor detecting part at the side away from the first substrate, the surface of the light-emitting component at the side away from the first substrate, and a surface of the at least one water vapor detecting part, which is farthest from the light-emitting component, at a side away from the light-emitting component; and
both the encapsulant and the thin film encapsulation layer are in contact with the first substrate.

8. The display panel according to claim 1, wherein,
the encapsulation part comprises an encapsulant and an second substrate;
the encapsulant covers the surface of the at least one water vapor detecting part at a side away from the first substrate, the surface of the light-emitting component at the side away from the first substrate, and a surface of one of the at least one water vapor detecting part, which is farthest from the light-emitting component, at a side away from the light-emitting component;
the encapsulant is in contact with the first substrate; and
the second substrate is located on a surface of the encapsulant at the side away from the first substrate.

9. The display panel according to claim 1 wherein
one of the at least one water vapor detecting part is disposed between one of the at least one blocking part and the light-emitting region.

10. The display panel according to claim 1, wherein,
the display panel comprises a plurality of blocking parts, and
one of the at least one water vapor detecting part is disposed between adjacent two of the plurality of blocking parts.

11. The display panel according to claim 1, wherein,
the material constituting the at least one hydrophilic film layer comprises polyvinyl alcohol; and
the material constituting the at least one hydrophobic film layer comprises polydimethylsiloxane.

12. The display panel according to claim 1, wherein, the display panel is an OLED display panel; and
the light-emitting component is an OLED light-emitting component.

13. A display device, comprising the display panel according to claim 1.

14. A preparation method of the display panel according to claim 1, wherein the method comprises:

forming at least one water vapor detecting part and a light-emitting component on a first substrate, wherein each of the at least one water vapor detecting part has different light transmittance before and after water absorption; and
forming an encapsulation part on the first substrate, thereby forming an receiving cavity, configured to receive the light-emitting component and the at least one water vapor detecting part, between the encapsulation part and the first substrate, wherein the receiving cavity has a light-emitting region inside, the light-emitting component is located within the light-emitting region, and the at least one water vapor detecting part is disposed outside the light-emitting region,
wherein the encapsulation part comprises a thin film encapsulation layer,
the thin film encapsulation layer at least covers a surface of the at least one water vapor detecting part at a side away from the first substrate and a surface of the light-emitting component at a side away from the first substrate;
the at least one blocking part is located on the first substrate and inside the receiving cavity;
the at least one blocking part is disposed outside the light-emitting region;
the at least one blocking part is configured to, in an ink-jet printing process, block organic solution which is to constitute the thin film encapsulation layer from overflowing from an outside of the light-emitting region to the light-emitting region;
wherein forming the at least one water vapor detecting part on the first substrate comprises:
coating hydrophobic solution and hydrophilic solution on the first substrate alternately, respectively surrounding the light-emitting region, to form at least one hydrophobic film layer and at least one hydrophilic film layer which are alternately stacked, wherein,
in cases that one of the at least one hydrophilic film layer absorbs water, there is to be a wrinkle at an interface between the one of the at least one hydrophilic film layer and one of the at least one hydrophobic film layer; and
the wrinkle changes the light transmittance of the at least one water vapor detecting part.

15. The preparation method according to claim 14, wherein forming the at least one water vapor detecting part on the first substrate further comprises:
patterning the at least one hydrophobic film layer and the at least one hydrophilic film layer, to form the at least one water vapor detecting part, wherein,
one of the at least one water vapor detecting part has a frame-like structure having a cross section of a closed shape in a direction parallel to the first substrate, and is disposed around the light-emitting region; or
one of the at least one water vapor detecting part is formed by a plurality of water vapor detecting sections which are spaced from each other and arranged around the light-emitting region.

16. A method for determining failure of the encapsulation part of the display panel according to claim 1, wherein the method comprises:
detecting light transmittance of the at least one water vapor detecting part, and determining whether the encapsulation part fails or not based on a result of the detecting.

* * * * *